United States Patent
Matsunaga et al.

(10) Patent No.: US 10,215,456 B2
(45) Date of Patent: Feb. 26, 2019

(54) REFRIGERANT DISTRIBUTION DEVICE AND COOLING APPARATUS

(71) Applicants: NEC Corporation, Tokyo (JP); NEC Platforms, Ltd., Kanagawa (JP)

(72) Inventors: Arihiro Matsunaga, Tokyo (JP); Masaki Chiba, Tokyo (JP); Minoru Yoshikawa, Tokyo (JP); Tadao Hosaka, Kanagawa (JP); Shunsuke Fujii, Kanagawa (JP); Akira Shoujiguchi, Tokyo (JP); Kenichi Inaba, Tokyo (JP); Masanori Sato, Tokyo (JP)

(73) Assignees: NEC Corporation, Tokyo (JP); NEC Platforms, Ltd., Kanagawa (JP)

(*) Notice: Subject to any disclaimer, the term of this patent is extended or adjusted under 35 U.S.C. 154(b) by 183 days.

(21) Appl. No.: 15/036,464

(22) PCT Filed: Dec. 5, 2014

(86) PCT No.: PCT/JP2014/006096
§ 371 (c)(1),
(2) Date: May 13, 2016

(87) PCT Pub. No.: WO2015/087530
PCT Pub. Date: Jun. 18, 2015

(65) Prior Publication Data
US 2016/0282023 A1    Sep. 29, 2016

(30) Foreign Application Priority Data

Dec. 13, 2013  (JP) ................................. 2013-257936

(51) Int. Cl.
*F25B 39/00* (2006.01)
*F28D 15/02* (2006.01)
(Continued)

(52) U.S. Cl.
CPC ............ *F25B 39/00* (2013.01); *F25B 23/006* (2013.01); *F25B 39/028* (2013.01);
(Continued)

(58) Field of Classification Search
CPC .. F25B 43/006; F25B 39/028; F25B 2400/16; F25B 2400/161; F25B 23/006; F25B 2500/01; F25B 39/00; F28D 15/0266
See application file for complete search history.

(56) References Cited

U.S. PATENT DOCUMENTS 5,507,159 A * 4/1996 Cooksey ............. F04B 39/0055
                                                  417/312
5,996,372 A * 12/1999 Koda ..................... F25B 43/006
                                                  62/471
(Continued)

FOREIGN PATENT DOCUMENTS

CN      200943980 Y     9/2007
CN      201225798 Y     4/2009
(Continued)

OTHER PUBLICATIONS

Extended European Search Report issued in European Patent Application No. 14869837.6, dated Sep. 13, 2017, 7 pages.
(Continued)

*Primary Examiner* — Frantz Jules
*Assistant Examiner* — Steve Tanenbaum
(74) *Attorney, Agent, or Firm* — Wilmer Cutler Pickering Hale and Dorr LLP

(57) ABSTRACT

In order to supply a refrigerant to multiple-stage heat receivers equally while saving space, a refrigerant distribution device to distribute a refrigerant supplied from the upper stream according to the present invention includes a main body including a side wall part, an upper face part and a bottom face part, an upstream pipe provided on the upper
(Continued)

face part in a manner communicating with an inside of the main body, a downstream pipe provided in a state partially inserted inside the main body via an under face hole part provided in the bottom face part, a tributary pipe provided in the side wall part or the bottom face part in a manner communicating with the inside of the main body, and a refrigerant direction changing means provided between the upstream pipe and the downstream pipe.

8 Claims, 10 Drawing Sheets

(51) Int. Cl.
*H05K 7/20* (2006.01)
*F25B 23/00* (2006.01)
*F25B 39/02* (2006.01)
*F28D 15/06* (2006.01)

(52) U.S. Cl.
CPC ......... *F28D 15/0266* (2013.01); *F28D 15/06* (2013.01); *H05K 7/20818* (2013.01); *F25B 2500/01* (2013.01)

(56) References Cited

U.S. PATENT DOCUMENTS

| | | | | |
|---|---|---|---|---|
| 5,996,972 | A * | 12/1999 | Kaiser | E01F 7/045 245/5 |
| 6,615,608 | B1 * | 9/2003 | Telesz | F25B 40/00 62/474 |
| 2006/0101850 | A1 * | 5/2006 | Taras | F25B 39/028 62/515 |
| 2010/0170584 | A1 | 7/2010 | Chung et al. | |

FOREIGN PATENT DOCUMENTS

| | | |
|---|---|---|
| CN | 201368623 Y | 12/2009 |
| CN | 201715787 U | 1/2011 |
| CN | 202501678 U | 10/2012 |
| CN | 102353187 B | 6/2013 |
| EP | 2893273 B1 * | 5/2016 ............. F25B 39/02 |
| JP | S58-192359 U | 12/1983 |
| JP | 63-143487 A | 6/1988 |
| JP | 1-123963 A | 5/1989 |
| JP | H03-129869 U | 12/1991 |
| JP | H05-312361 A | 11/1993 |
| JP | H06-195130 A | 7/1994 |
| JP | 08-068575 | 3/1996 |
| JP | H09-159320 A | 6/1997 |
| JP | 2005-163744 A | 6/2005 |
| JP | 2005-228216 A | 8/2005 |
| JP | 2012-042092 A | 3/2012 |
| JP | 2013-065227 A | 4/2013 |

OTHER PUBLICATIONS

Chinese Office Action issued by the State Intellectual Property Office of the People's Republic of China for Chinese Application No. 201480068292.0 dated May 31, 2017 (16 pages).

Singapore Office Action issued by the Intellectual Property Office of Singapore for Singapore Application No. 11201604782P dated May 29, 2017 (6 pages).

International Search Reporting corresponding to PCT/JP2014/006096, dated Mar. 10, 2015, 1 page.

Written Opinion of the ISA for PCT/JP2014/006096 with English Translation, dated Mar. 10, 2015, 7 pages.

Chinese Office Action issued by the State Intellectual Property Office of the People's Republic of China for Chinese Application No. 201480068292.0 dated Jan. 25, 2018 (19 pages).

Korean Office Action issued by the Korean Intellectual Property Office for Korean Application No. 10-2016-7015356 dated Feb. 23, 2018 (16 pages).

Notification of Reasons for Refusal issued by the Japan Patent Office for Japanese Application No. 2015-552330 dated Oct. 16, 2018 (7 pages).

* cited by examiner

REFRIGERANT DISTRIBUTION DEVICE AND COOLING APPARATUS

CROSS-REFERENCE TO RELATED APPLICATIONS

This application is a national stage application of International Application No. PCT/JP2014/006096 entitled "REFRIGERANT DISTRIBUTION DEVICE AND COOLING APPARATUS," filed on Dec. 5, 2014, which claims the benefit of the priority of Japanese Patent Application No. 2013-257936 filed on Dec. 13, 2013, the disclosures of each of which are hereby incorporated by reference in their entirety.

TECHNICAL FIELD

The present invention relates to a refrigerant distribution device of a cooling apparatus for cooling exhaust heat of electronic equipment, and to a cooling apparatus.

BACKGROUND ART

Along with development of the information society, substantial increase of the amount of information has been expected in recent years. Due to such increased information, necessity to install a lot of electronic equipment such as a server having a high information processing capacity has arisen. Generally, electronic equipment having a high information processing capacity is electronic equipment with high power consumption. In addition, because most of electric power consumed by electronic equipment becomes heat, installing electronic equipment having a high information processing capacity results in making the surrounding temperature rise due to its exhaust heat. In particular, in a data center in which a large number of electronic equipment such as servers are installed, a great deal of heat is exhausted from the electronic equipment, and the heat needs to be cooled to keep the functions of the electronic equipment. Therefore, a lot of air conditioning electric power is needed. As a consequence, a method to reduce an air conditioning load by absorbing heat of electronic equipment and transporting it to some other place is required.

As a method for absorbing heat of electronic equipment, a means for absorbing heat of electronic equipment by circulating a refrigerant using a phase change of the refrigerant without using a pump has been thought of. This method is very economical because motive power is not used for circulation of a refrigerant. In addition, when a refrigerant of an insulation property is used as an inner refrigerant, even if the inner refrigerant leaks due to damage of a certain portion, influence on electronic equipment is very small. Accordingly, the means using a phase change of a refrigerant is a very effective means for absorbing exhaust heat of electronic equipment such as servers in a data center that are not allowed to stop.

A heat absorbing means using a phase change of a refrigerant will be described simply using FIG. 1 and FIG. 2. FIG. 1 is a schematic diagram of a cooling apparatus for absorbing exhaust heat of electronic equipment 6, and FIG. 2 is a diagram of a cooling apparatus attached to a rack 5 storing the electronic equipment 6.

In the exhaust side of the rack 5 storing a lot of pieces of electronic equipment 6, a heat receiver 1 to absorb exhaust heat of the electronic equipment 6 is installed. A radiator 2 is installed above the heat receiver 1, and the heat receiver 1 and the radiator 2 are communicated with each other by two pipes of a vapor-phase pipe 3 through which a vapor-phase refrigerant passes and a liquid-phase pipe 4 through which a liquid-phase refrigerant passes. A refrigerant is sealed in the interior, and, in the heat receiver 1, external heat is received, and a liquid-phase refrigerant boils to cause a phase change to a vapor-phase refrigerant. The phase-changed vapor-phase refrigerant moves to the radiator 2 through the vapor-phase pipe 3 by the buoyancy, its heat is taken away by a cooler such as a fan and a water cooler, and it is liquefied and changes its phase to a liquid-phase refrigerant. The liquid-phase refrigerant descends by the gravity through the liquid-phase pipe 4, and flows back into the heat receiver 1.

Regarding the rack 5 into which the electronic equipment 6 such as a server is mounted, its size that is commonly used in a data center and the like is about 2 m in height. When the system shown in FIG. 2 is applied to a rack of such size, there is a problem that a refrigerant is pooled in the lower part due to the own weight of a liquid-phase refrigerant, and a refrigerant is not supplied to the heat receiver 1 in the upper side.

In order to solve this problem, there is disclosed in patent literature 1 and patent literature 2 a technology in which a heat receiver is divided into multiple pieces to make it be of multiple stages in the vertical direction, and a plurality of refrigerant distribution devices are provided in portions at which branching from each liquid-phase pipe to each of the plurality of heat receivers is made.

In this technology, a liquid-phase refrigerant flows into a refrigerant distribution device and, through a pipe provided in its lower part, the liquid-phase refrigerant is supplied to each heat receiver. When a refrigerant is supplied to each heat receiver sufficiently, overflow is caused inside the refrigerant distribution device in question, and the overflowed refrigerant passes through a pipe, which is provided in a side face of the device and which leads to a downward liquid-phase pipe, and heads for the refrigerant distribution device for supplying a refrigerant to the next heat receiver. By this structure, it becomes possible to supply a refrigerant to each heat receiver equally, and thus not to deteriorate the heat absorbing performance of the upper part of a rack.

CITATION LIST

Patent Literature

[PTL 1] Japanese Patent Application Laid-Open No. 1994-195130
[PTL 2] Japanese Patent Application Laid-Open No. 1993-312361

SUMMARY OF INVENTION

Technical Problem

However, a refrigerant branching device of a cooling apparatus described in patent literature 1 and patent literature 2 has the following problem.

Many of racks for storing electronic equipment are configured in a manner that they can store electronic equipment of a width of 19 inches (about 483 mm), and thus the width of a rack itself will be a size of about 600-700 mm. In order to increase heat receiving performance under a condition that a width has been decided, it is necessary to make the area of a heat receiver large.

In patent literature 1, there is disclosed a refrigerant distribution device in which, along with a rise of a solution level of refrigerant liquid in a tank, a float member arranged in the tank also rises and a valve mechanism in the pipe is closed, and thereby the liquid level is controlled. Because a float member needs to be provided, the refrigerant distribution device is large, and thus a heat receiver becomes small to fail to obtain an enough heat receiving area. As a result, enough heat absorbing performance cannot be secured.

In patent literature 2, when a downstream liquid-phase pipe which flows to a downward refrigerant distribution device is provided in a side face of a refrigerant distribution device, a bent part of the pipe has to be set up. Accordingly, the proportion of the pipe to the width becomes large, and an enough heat receiving area cannot be obtained for a heat receiver. As a result, enough heat absorbing performance cannot be secured. Even if an upstream liquid-phase pipe and a downstream liquid-phase pipe are arranged such that the spindles of them are made to be a straight line to make a pipe laying space small and, by this, a heat receiving area is made large, a liquid-phase refrigerant is forced to flow into the downstream liquid-phase pipe directly when it descends downward. Therefore, a liquid-phase refrigerant cannot be supplied to a heat receiver sufficiently, and enough heat absorbing performance cannot be obtained.

An object of the present invention is to supply a refrigerant to multiple-stage heat receivers equally, and provide a space-saving refrigerant distribution device and a space-saving cooling apparatus.

Solution to Problem

In order to supply a refrigerant to multiple-stage heat receivers equally while saving space, a refrigerant distribution device to distribute a refrigerant supplied from the upper stream according to the present invention includes a main body having a side wall part, an upper face part and a bottom face part, an upstream pipe provided on the upper face part in a manner communicating with an inside of the main body, a downstream pipe provided in a state partially inserted inside the main body via an under face hole part provided in the bottom face part, a tributary pipe provided on the side wall part or the bottom face part in a manner communicating with an inside of the main body, and a refrigerant direction changing means provided between the upstream pipe and the downstream pipe.

Advantageous Effects of Invention

According to the present invention, a refrigerant is supplied to multiple-stage heat receivers equally, and space saving can be realized.

DESCRIPTION OF EMBODIMENTS

Hereinafter, exemplary embodiments of the present invention will be described in detail with reference to drawings. However, although technically desirable restrictions to work the present invention are made in the exemplary embodiments described below, the scope of the invention is not limited to the followings.

(First Exemplary Embodiment)

Figure 1:
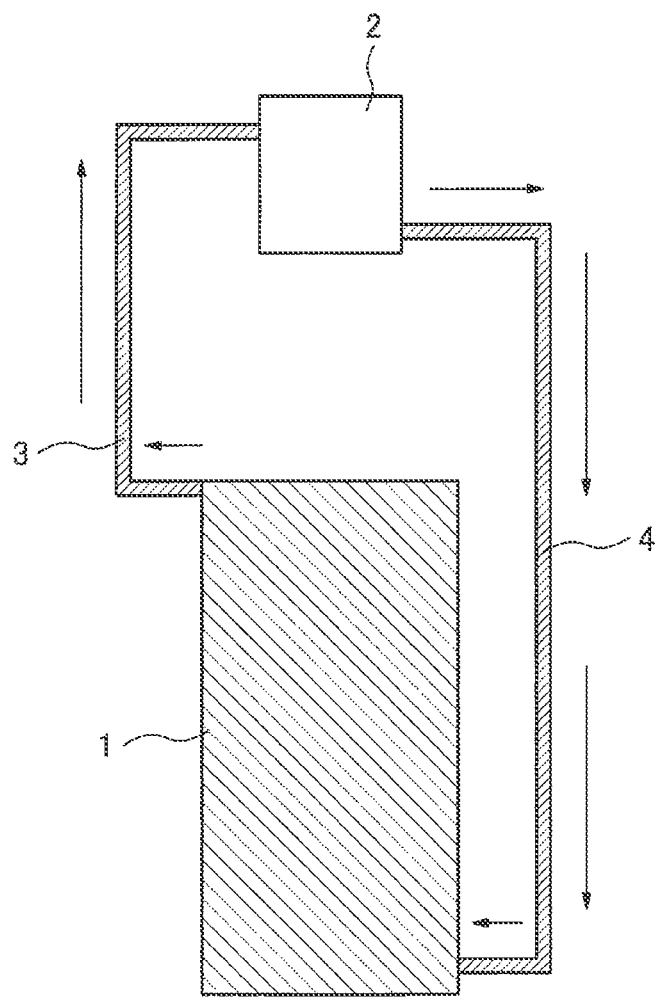
FIG. 1 is a schematic diagram of a means for absorbing exhaust heat of electronic equipment.
Figure 2:
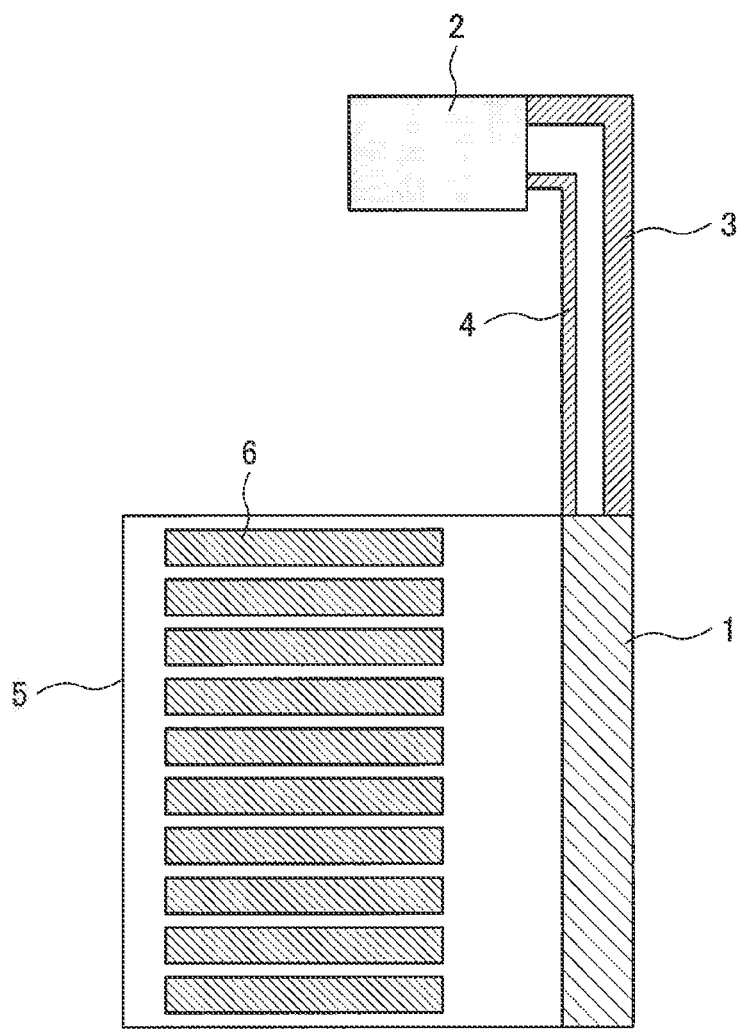
FIG. 2 is an installation diagram of a means for absorbing exhaust heat of electronic equipment and a rack.
Figure 3:
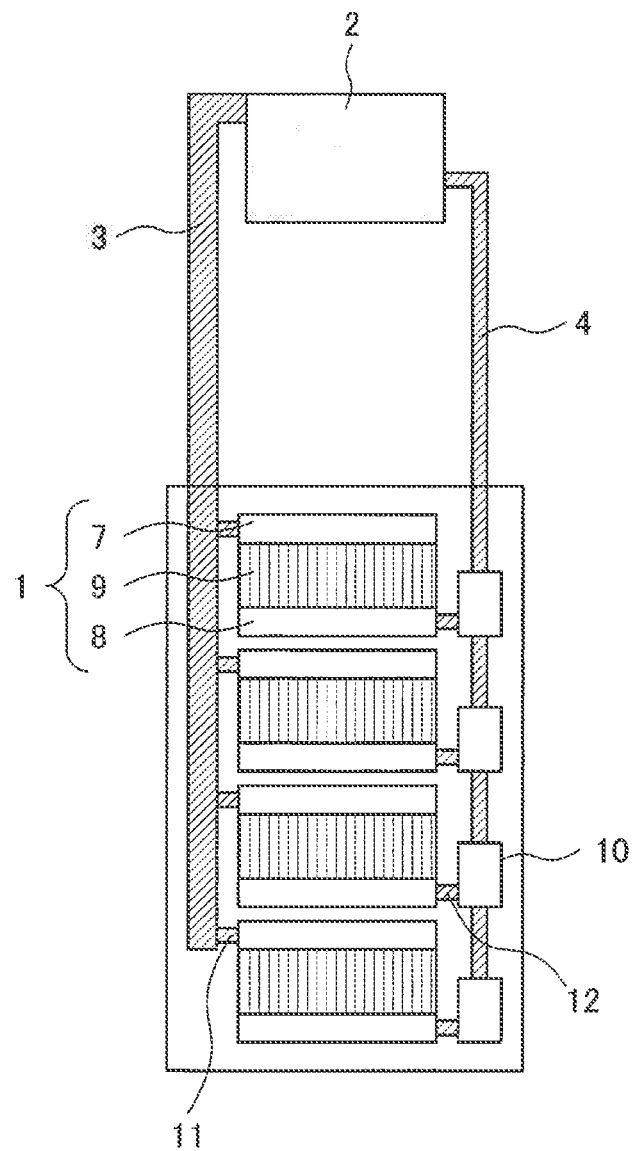
FIG. 3 is a schematic diagram of a cooling apparatus of a first exemplary embodiment of the present invention.

This exemplary embodiment will be described in detail. FIG. 3 shows a general view of a cooling apparatus including a refrigerant distribution device of this exemplary embodiment.

In a cooling apparatus of this exemplary embodiment, the heat receiver 1 is arranged in a side face (the exhaust side) of a storing body in which a lot of electronic equipment, such as a server, exhausting high calorific power are arranged, and the radiator 2 that is communicated with the heat receiver 1 by pipes is arranged above the storing body. Specifically, the cooling apparatus is of a structure in which the storing body and the heat receiver 1 are installed in a building, the radiator 2 is installed outside the building, and the heat receiver 1 and the radiator 2 are in communication with each other by two pipes.

In this exemplary embodiment, it is assumed that a storing body for arranging electronic equipment is a 19-inch rack that is used for storing a lot of electronic equipment such as servers and network devices. For example, a 19-inch rack may be a rack of JIS standard (Japanese Industrial Standards) or may be a rack of EIA standard (Electronic Industries Alliance Standard). Although a 19-inch rack is assumed in this exemplary embodiment, a rack is not limited to this if it is similar one.

A plurality of heat receiver 1 are installed (in multistage) in the exhaust side, and line up in the height of the rack direction. The heat receiver 1 absorbs exhaust heat of electronic equipment by making an inner liquid-phase refrigerant boil and making it cause a phase change to a vapor-phase refrigerant.

Each heat receiver 1 includes a tube whose inside is of a hollow shape, a fin 9 arranged on the tubular pipe, and headers 7 and 8 arranged at the top and the bottom of those. At a side face of the upper part header 7, the heat receiver 1 is in communication with a vapor-phase tributary pipe 11 that is in communication with the vapor-phase pipe 3 through which a vapor-phase refrigerant passes. That is, the vapor-phase pipe 3 is in communication with each heat receiver 1 via each vapor-phase tributary pipe 11 that communicates with each heat receiver 1. Similarly, at a side face of the lower header 8, the heat receiver 1 is communicated with a liquid-phase tributary pipe 12 which is in communication with a tributary opening of a refrigerant distribution device 10, and thereby a liquid-phase refrigerant is supplied.

The vapor-phase pipe 3 has a manifold-like shape in which vapor-phase refrigerants which flow out through the vapor-phase tributary pipe 11 from each heat receiver 1 join. The vapor-phase pipe 3 extends to the radiator 2 installed above the heat receiver 1 and is in communication with the radiator 2. Meanwhile, it is desired that the vapor-phase pipe 3 have a diameter larger than that of the liquid-phase pipe 4 because a volume becomes about some hundreds times as large as that of a liquid-phase refrigerant. A pipe from each vapor-phase tributary pipe 11 that communicates with each heat receiver 1 to the vapor-phase pipe 3 that communicates with the radiator 2 may be made be a first pipe. In this case, the first pipe branches at a plurality of positions to communicate with each heat receiver 1.

The radiator 2 radiates heat transported by a vapor-phase refrigerant. In the present invention, heat radiation may be performed by heat exchange between a vapor-phase refrigerant and water, or may be performed by heat exchange between air and a vapor-phase refrigerant. When heat is exchanged with water, heated water is cooled by a chiller or a cooling tower, and circulated by a pump or the like. When heat is exchanged with air, air is sent by a fan or the like to the radiator 2, and the air which has performed heat exchange with a vapor-phase refrigerant is discharged to a space separated from the space where the rack is installed. The cooled vapor-phase refrigerant is condensed and changes its phase to a liquid-phase refrigerant.

The liquid-phase pipe 4 through which the liquid-phase refrigerant flows back is installed opposite to the vapor-phase pipe 3 in the exhaust side of the rack, and the refrigerant distribution device 10 is provided in each of portions at which branching from the liquid-phase pipe 4 to each heat receiver 1 is made, and a liquid-phase refrigerant of a proper quantity is supplied to each heat receiver 1 via the liquid-phase tributary pipe 12. A plurality of refrigerant distribution device 10 are connected in the vertical direction in series via the liquid-phase pipe 4. Each refrigerant distribution device 10 is in communication with each heat receiver 1 via the liquid-phase tributary pipe 12 that communicates with each heat receiver 1. The refrigerant distribution device 10 existing at the bottom end of the liquid-phase pipe 4 supplies all liquid-phase refrigerant to the heat receiver 1 in the lower end without pouring it into a lower portion. The pipe from the liquid-phase pipe 4 that communicates with the radiator 2 to the liquid-phase tributary pipe 12 that communicates with each heat receiver 1 may be made be a second pipe. In this case, the second pipe branches at a plurality of portions to communicate with each heat receiver 1, and the refrigerant distribution device 10 is installed in each of the branch portions.

A refrigerant is enclosed into these devices, and, after that, the devices are depressurized by vacuum suction or the like, and are made airtight.

Regarding a refrigerant, a refrigerant of an insulation property is used considering use for electronic equipment. Specifically, HFC (hydro fluorocarbon: hydrofluorocarbon) and HFE (hydro fluoro ether: hydro-fluoro ether) are being used, but the material is not limited to these.

Figure 4:
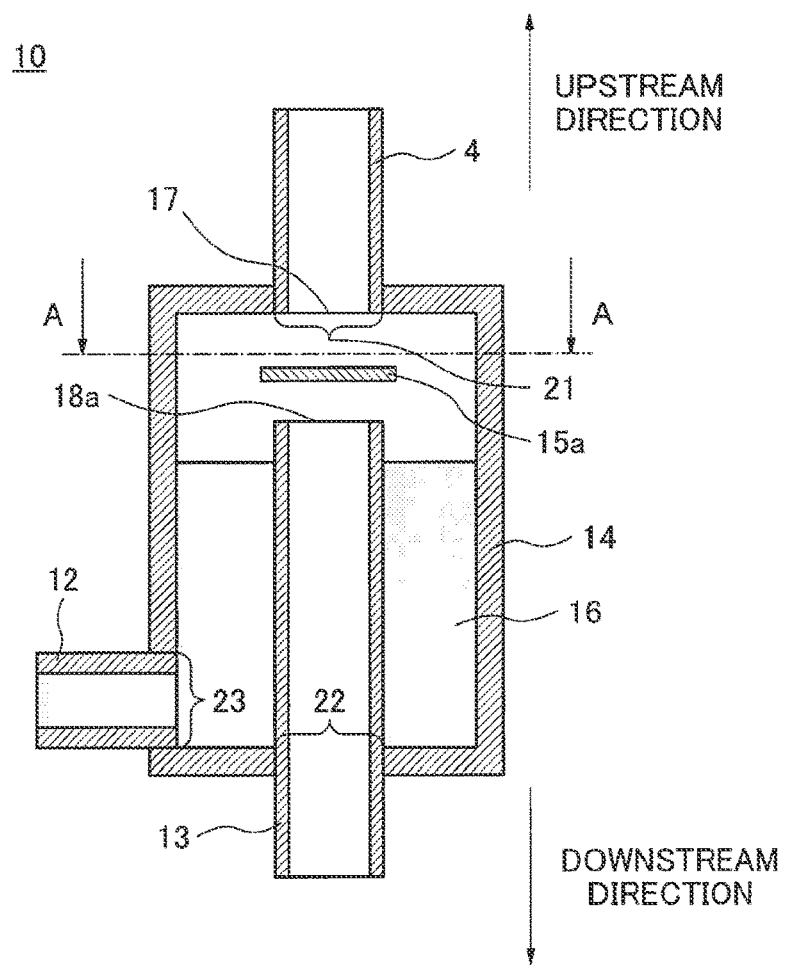
FIG. 4 is a sectional view of a refrigerant distribution device of the first exemplary embodiment of the present invention.
Figure 5:
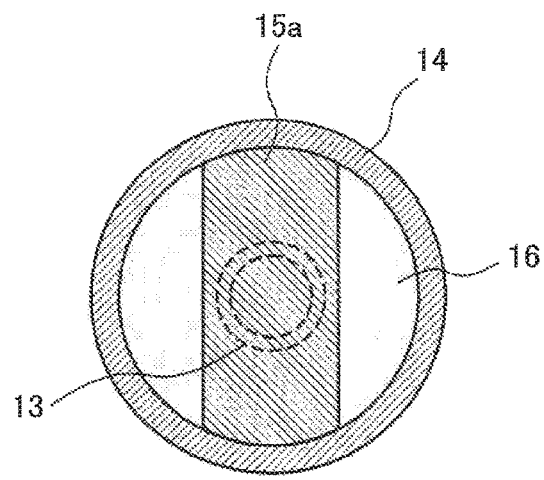
FIG. 5 is a sectional view seen from A of FIG. 4.

Next, using FIG. 4 and FIG. 5, the refrigerant distribution device 10 of this exemplary embodiment mentioned above will be described in detail. FIG. 4 is a sectional view of the refrigerant distribution device 10, and FIG. 5 is a sectional view seen from point A indicated in FIG. 4.

The refrigerant distribution device 10 forms its main body by side wall parts by a branch outer wall 14, an upper face part, and a bottom face part. An upper face hole part 21 is provided in the upper face part, and it is joined to an upstream liquid-phase pipe opening 17 of the upstream liquid-phase pipe 4 that is an upstream pipe extending in an upstream direction. The upstream liquid-phase pipe 4 may be of a shape unified with the upper face part. A refrigerant sucking pipe 13 which is a downstream pipe is formed in a manner that part of it is inserted inside the main body, and it extends in the downstream direction via an under face hole part 22 provided in the bottom face part. A refrigerant sucking pipe opening 18a is provided at an end of the refrigerant sucking pipe 13. The liquid-phase tributary pipe 12 is joined to a side wall hole part 23 provided at a side wall part. The liquid-phase tributary pipe 12 may be of a shape unified with the side wall part. The liquid-phase tributary pipe 12 may be joined to the bottom face part because it only has to be provided in a position lower than the height of the refrigerant sucking pipe opening 18a. A direction changing board 15a which is a refrigerant direction changing means is provided between the refrigerant sucking pipe opening 18a and the upstream liquid-phase pipe opening 17.

This exemplary embodiment will be described in detail below.

The refrigerant distribution device 10 of this exemplary embodiment communicates with the liquid-phase pipe 4 in the upper stream and is in communication with the liquid-phase pipe 4 in the down stream through the inside refrigerant sucking pipe 13. Also, with the liquid-phase tributary pipe 12 that is connected with each heat receiver 1, a storage part 16 in the lower part of the branch outer wall 14 is communicated. In the interior, the direction changing board 15a that functions as a refrigerant direction changing means for changing the direction of a flow of a liquid-phase refrigerant, descending from the upstream liquid-phase pipe 4, to a direction toward the branch outer wall 14 is provided between the upstream liquid-phase pipe 4 and the refrigerant sucking pipe 13.

The branch outer wall 14 that is the outer wall of the refrigerant distribution device 10 has a size larger than the diameter of the liquid-phase pipe 4. Although the shape may be a cylinder or a rectangular parallelepiped, a cylinder is desirable when manufacturing is taken into account. When the branch outer wall 14 is too small, the refrigerant sucking pipe 13 and the storage part 16 located in the branch outer wall 14 become small, and, in a case where a large flow amount descends from the upper stream, overflow occurs immediately and a refrigerant cannot be supplied to the heat receiver 1 appropriately. In addition, pressure loss of a liquid-phase refrigerant passing through the storage part 16 is increased, and a refrigerant amount supplied to the heat receiver 1 becomes smaller.

On the contrary, when the branch outer wall 14 is too large, it takes time for a liquid-phase refrigerant to overflow, and a liquid-phase refrigerant cannot be supplied to the heat receiver 1 in a lower portion at appropriate timing. Furthermore, when the branch outer wall 14 is too large, a large space is needed, and, thus, in a case where a cooling apparatus of this exemplary embodiment is installed in a rack or the like, the heat receiver 1 has to be made small, resulting in deterioration of heat absorbing performance.

Therefore, it is desired that the diameter of the branch outer wall 14 be small within a range that does not obstruct a flow to the liquid-phase tributary pipe 12. Specifically, it is desired that it be of a size from 1.2 to 5 times as large as the diameter of the liquid-phase pipe 4. That is, a cross-sectional area of the main body can be smaller than the sum of the cross-sectional area of the liquid-phase pipe 4 and the cross-sectional area of the refrigerant sucking pipe 13.

The length of the branch outer wall 14 in the descending direction of the liquid-phase refrigerant is set so that the refrigerant sucking pipe 13 can be housed and the intervals between the direction changing board 15a, the upstream liquid-phase pipe opening and the refrigerant sucking pipe opening 18a may be kept appropriately.

Inside the branch outer wall 14, the refrigerant sucking pipe 13 of the shape projecting in the center is arranged such that the refrigerant sucking pipe 13 and the upstream liquid-phase pipe 4 form a straight line. It is desired that the diameter of the refrigerant sucking pipe 13 be the same as the diameter of the liquid-phase pipe 4 considering that it is connected with the liquid-phase pipe 4. When the position of the refrigerant sucking pipe opening 18a is too high, a level of a liquid-phase refrigerant stored in the storage part 16 becomes the position of the vapor-phase tributary pipe 11 of the heat receiver 1. In this state, a liquid-phase refrigerant flows into the vapor-phase pipe 3 through the vapor-phase tributary pipe 11 of the heat receiver 1, and disturbs a rising flow of a vapor-phase refrigerant to deteriorate heat absorbing performance.

On the contrary, when the position of the refrigerant sucking pipe opening 18a is too low, an enough liquid-phase refrigerant is not pooled in the storage part 16, and a sufficient liquid-phase refrigerant cannot be supplied to the heat receiver 1. Therefore, the position of the refrigerant sucking pipe opening 18a is fixed at a position with which a liquid-phase refrigerant does not flow into the vapor-phase pipe and, at the same time, a liquid-phase refrigerant of a sufficient height can be stored in the storage part 16. Specifically, it is desired that the position of the refrigerant sucking pipe opening 18a be above the upper surface of the liquid-phase tributary pipe 12 and below the under surface of the vapor-phase tributary pipe 11 of the heat receiver 1 connected with the refrigerant distribution device 10 in question.

The direction changing board 15a is provided at a position and with a size that a liquid-phase refrigerant which descends from the upstream liquid-phase pipe 4 is not directly poured from the refrigerant sucking pipe opening 18a into the refrigerant sucking pipe 13. Specifically, the direction changing board 15a is provided between the upstream liquid-phase pipe opening 17 and the refrigerant sucking pipe opening 18a in a size about the same as the diameter of the refrigerant sucking pipe 13. The shape of the direction changing board 15a may be a circle or a rectangular shape. When the position of the direction changing board 15a approaches the side of the upstream liquid-phase pipe 4 too much, a flow of a liquid-phase refrigerant which descends from the upstream liquid-phase pipe 4 is disturbed instead and decrease of heat absorbing performance is caused due to deteriorated circulation. Conversely, when the position of the direction changing board 15a approaches the refrigerant sucking pipe 13 too much, a flow of a liquid-phase refrigerant that overflows from the storage part 16 into the refrigerant sucking pipe 13 is obstructed, and this also deteriorates the circulation, resulting in leading to decrease of heat absorbing performance.

Therefore, the direction changing board 15a is provided in a position at which it does not obstruct a flow of a liquid-phase refrigerant which descends from the upstream liquid-phase pipe 4 and a flow from the storage part 16 to the refrigerant sucking pipe 13. Specifically, it is desired that an area made by the height between the direction changing board 15a and the upstream pipe opening and the perimeter of the direction changing board 15a be equal to or larger than the cross-sectional area of the liquid-phase pipe 4. It is also desired to make an area made by the height between the direction changing board 15a and the refrigerant sucking pipe opening 18a and the perimeter of the direction changing board 15a be equal to or larger than the cross-sectional area of the refrigerant sucking pipe 13.

Regarding a fixation method of the direction changing board 15a, part of the direction changing board 15a is made touch the branch outer wall 14 and is fixed to the branch outer wall 14 by welding, brazing or the like. On this occasion, it may be such that a hole is provided in a portion extending to the branch outer wall 14 from the direction changing board 15a, and fixation is made by a screw or the like. The direction changing board 15a may have a structure united with the main body.

It is desired that the opening that communicates with the liquid-phase tributary pipe 12 be provided in the lower part of the storage part 16. By doing so, the force to push out a refrigerant to the liquid-phase tributary pipe 12 increases due to the storage part 16 having a pool and a height, and thus it becomes possible to supply a liquid-phase refrigerant of a larger amount to the heat receiver 1.

In the exemplary embodiment described above, the branch outer wall 14, the upstream liquid-phase pipe 4 and the refrigerant sucking pipe 13 can be formed by metal such as aluminum and stainless steel. Regarding the direction changing board 15a, there are no restrictions in its material in particular if it has a predetermined heating resistance.

Figure 6:
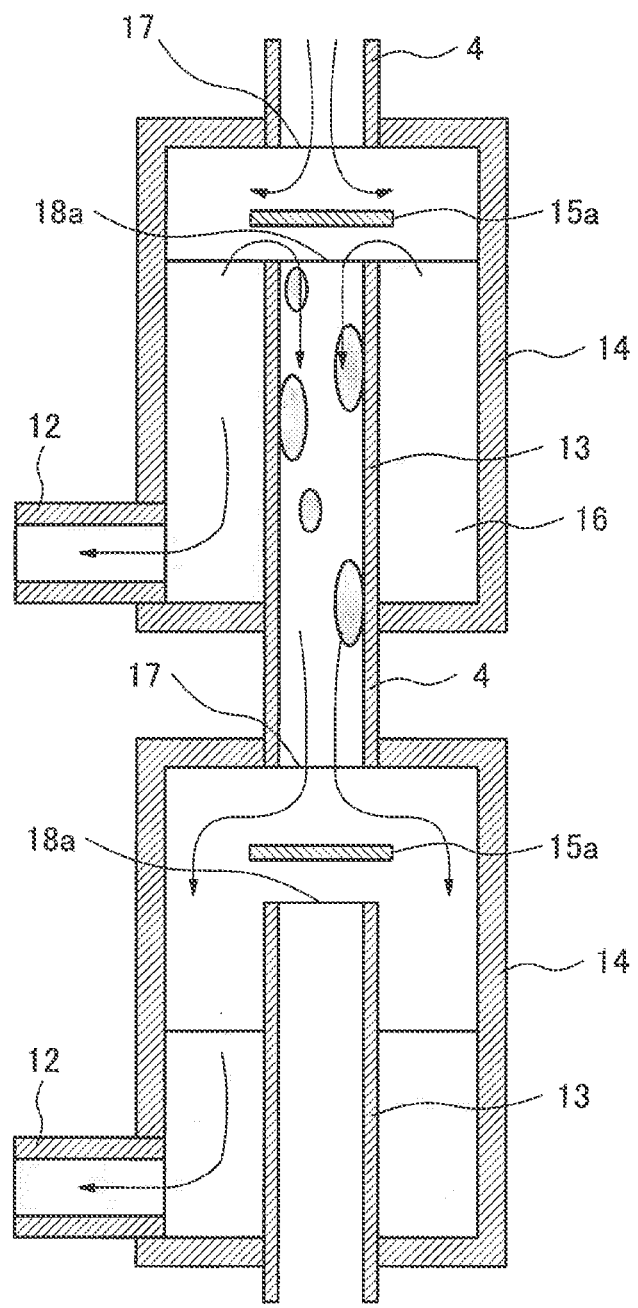
FIG. 6 is an operating diagram of a refrigerant distribution device of the first exemplary embodiment of the present invention.

Next, an operation diagram of the refrigerant distribution device 10 of this exemplary embodiment will be described with reference to FIG. 6.

By its internal structure, the refrigerant distribution device 10 makes a liquid-phase refrigerant descend to the refrigerant distribution device 10 in the lower position while distributing a liquid-phase refrigerant of a proper quantity to the heat receiver 1 connected with itself. A liquid-phase refrigerant which has flowed back into each heat receiver 1 boils by receiving exhaust heat of electronic equipment again and absorbs the heat by becoming a vapor-phase refrigerant and, by the vapor-phase refrigerant moving, heat transportation to the radiator 2 is made.

In the refrigerant distribution device 10, a liquid-phase refrigerant which has descended from the upstream liquid-phase pipe 4 hits the direction changing board 15a first, and, by this, its descending direction is changed, and, as a result, it does not enter the refrigerant sucking pipe 13 directly and is stored in the surrounding storage part 16. The liquid-phase tributary pipe 12 is communicated with the storage part 16, and, through the liquid-phase refrigerant distribution device 10, a liquid-phase refrigerant in the storage part 16 is flowed back to the heat receiver 1. A liquid-phase refrigerant stored in the storage part 16 always touches the refrigerant sucking pipe 13 and makes the refrigerant sucking pipe 13 be in an temperature almost identical with that of the liquid-phase refrigerant.

When a liquid-phase refrigerant exceeding the capacity of the storage part 16 descends from the upstream liquid-phase pipe 4, a liquid-phase refrigerant of the storage part 16 overflows and flows into the refrigerant sucking pipe 13 through the refrigerant sucking pipe opening 18a. At that time, because the refrigerant sucking pipe 13 is always in a temperature identical with the liquid-phase refrigerant in the storage part 16, even if the outside is hotter than the exhaust heat of the electronic equipment, there are no cases that the refrigerant boils and disturbs a flow of a liquid-phase refrigerant that overflows and flows in.

Meanwhile, it is possible that the liquid-phase pipe 4 connecting with the refrigerant sucking pipe 13 becomes hot because it contacts with outside air. However, a liquid-phase refrigerant will have a certain degree of flow velocity while it is descending in the refrigerant sucking pipe 13, and thus, even if it touches the liquid-phase pipe 4 that has become hot and even if there is boiling there, the liquid-phase refrigerant can overcome that and descend because it has a certain degree of flow velocity.

A refrigerant which has descended from the refrigerant sucking pipe 13 passes through the liquid-phase pipe 4 and supplies a liquid-phase refrigerant to the next refrigerant distribution device 10 or to the next heat receiver 1 in the case of the end portion.

According to this exemplary embodiment, by providing the direction changing board 15a between the upstream liquid-phase pipe 4 and the refrigerant sucking pipe 13, a liquid-phase refrigerant can be distributed to the refrigerant distribution device 10 in the lower portion while supplying a liquid-phase refrigerant to the heat receiver 1 through the liquid-phase tributary pipe 12 in communication with the storage part 16. Further, because the upstream liquid-phase pipe 4 and the refrigerant sucking pipe 13 can be arranged in a linear fashion, an installation space can be reduced substantially. As a result, it becomes possible to make the area of the heat receiver 1 large to the maximum in cases of rack installation or the like in which an installation space is limited, and thus heat absorbing performance can be improved.

In addition, by the refrigerant sucking pipe 13 being inserted partially into the inside of the main body part, a liquid-phase refrigerant stored in the storage part 16 of the refrigerant distribution device 10 will always touch the refrigerant sucking pipe 13, and, thus, the refrigerant sucking pipe 13 can be kept in a temperature identical with the temperature of the liquid-phase refrigerant. Therefore, when a liquid-phase refrigerant stored in the storage part 16 overflows and the liquid-phase refrigerant flows into the refrigerant sucking pipe 13, there are no cases that the liquid-phase refrigerant boils and obstructs a flow of a liquid-phase refrigerant flowing in. As a result, it is possible to efficiently distribute a refrigerant to each heat receiver 1 and make it circulate, and, thus, there are no cases where heat absorbing performance is deteriorated. Furthermore, because a liquid-phase refrigerant has a certain degree of flow velocity, even if it contacts with the liquid-phase pipe 4 that has become hot, and is boiled, it can overcome that and descend.

(Second Exemplary Embodiment)

Figure 7:
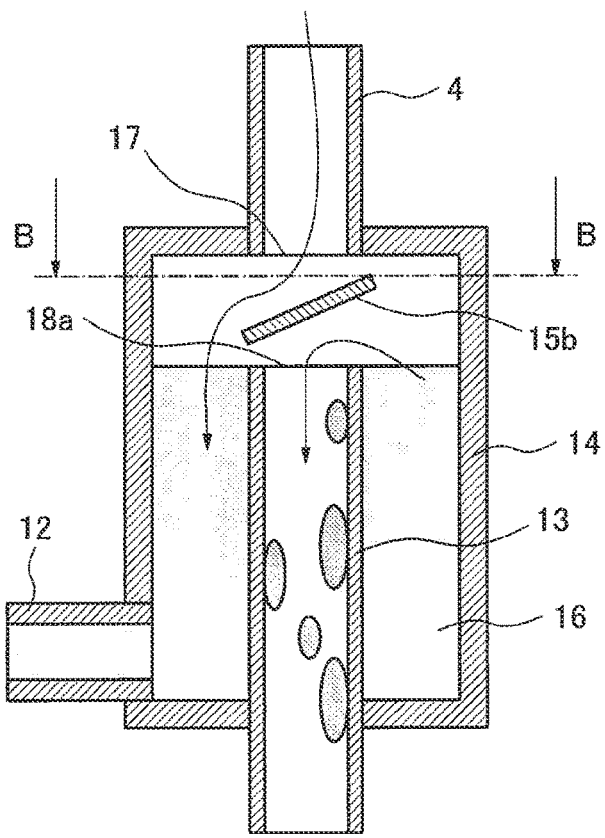
FIG. 7 is a sectional view of a refrigerant distribution device of a second exemplary embodiment.
Figure 8:
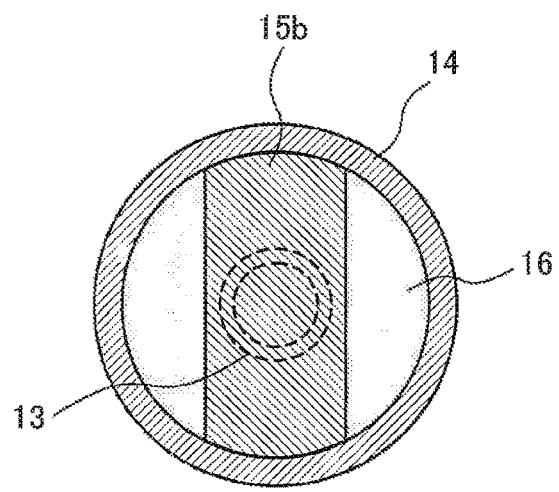
FIG. 8 is a sectional view seen from B of FIG. 7.

The second exemplary embodiment will be described with reference to FIG. 7 and FIG. 8. FIG. 7 is a sectional view of the refrigerant distribution device 10 of this embodiment, and FIG. 8 is a sectional view seen from the dots shown in FIG. 7.

Because the cooling apparatus of this exemplary embodiment is only different in the structure of the refrigerant distribution device 10 described in the first exemplary embodiment, the description will be omitted about the other parts.

A difference between this exemplary embodiment and the first exemplary embodiment exists in the structure of a direction changing board 15b. Specifically, the direction changing board 15b is arranged in a manner that a liquid-phase refrigerant from the upper stream flows into the storage part 16 via the direction changing board 15b that is tilted relative to the flow direction of the upstream liquid-phase pipe 4 and the refrigerant sucking pipe 13. In order to make, by the direction changing board 15b, a flow of a liquid-phase refrigerant which descends from an upstream liquid-phase pipe and a flow of a liquid-phase refrigerant which flows into the refrigerant sucking pipe 13 from the storage part 16 not interfere with each other, the direction changing board 15b needs to be tilted so that the difference of the closest distance between the direction changing board 15b and the refrigerant sucking pipe opening 18a and the farthest distance between them are large sufficiently. Specifically, it is desired that an inclined angle to tilt the direction changing board 15b be 30 to 85 degrees to the flow direction of the upstream liquid-phase pipe 4 and the refrigerant sucking pipe 13.

In this exemplary embodiment, there is no need to fix the inclined angle to tilt the direction changing board 15b, and it may be of a variable structure. In that case, the inclined angle may be changed manually or may be changed by automatic control.

In this exemplary embodiment, when a liquid-phase refrigerant which has descended from the upper stream hits the direction changing board 15b and changes the direction of the flow, loss when changing the direction of a flow is small because the direction changing board 15b tilts to a direction to lead to the storage part 16. In addition, because the direction changing board 15b is tilted, a distance between the refrigerant sucking pipe 13 and the direction changing board 15b is small at a certain portion and large at a face in a portion opposite to the former portion. In portions where the distance between the direction changing board 15b and the refrigerant sucking pipe 13 is small, it is difficult for a liquid-phase refrigerant overflowing from the storage part 16 to flow into the refrigerant sucking pipe 13, and, therefore, a liquid-phase refrigerant overflows and flows into the refrigerant sucking pipe 13 in portions in the opposite side.

In addition, the portions where the distance between the direction changing board 15b and the sucking pipe is small will be portions where a liquid-phase refrigerant from the upper stream is easy to flow in due to the angle of the direction changing board 15b. Therefore, it is possible to separate an area where a liquid-phase refrigerant flows into from the upper stream and an area where a liquid-phase refrigerant overflows and flows into the refrigerant sucking pipe 13. By this, a liquid-phase refrigerant which descends from the upper stream and a liquid-phase refrigerant which overflows and flows into the refrigerant sucking pipe 13 do not interfere with each other. Thus, by the structure of this exemplary embodiment, a flow in the refrigerant distribution device 10 can be made more efficient, and heat absorbing performance can be improved further.

(Third Exemplary Embodiment)

Figure 9:
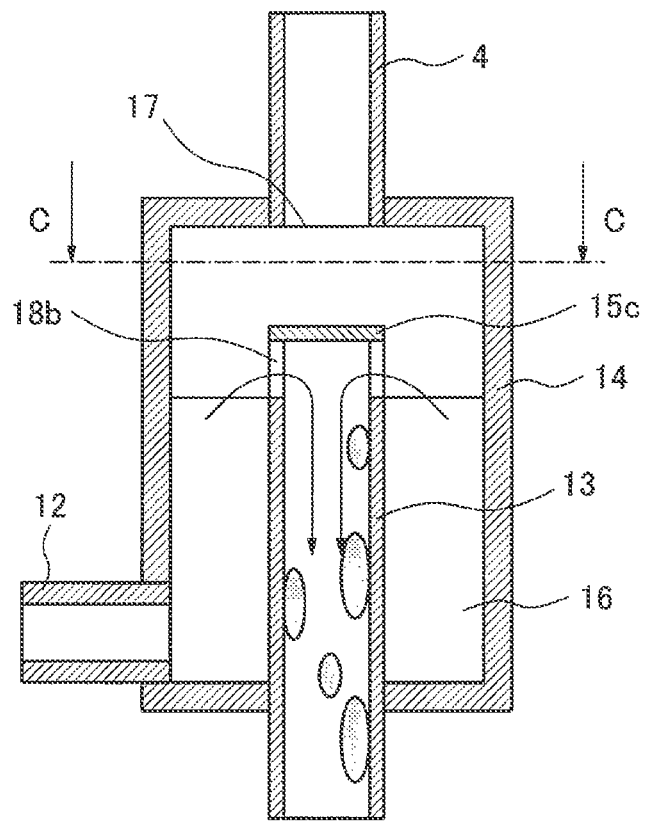
FIG. 9 is a sectional view of a refrigerant distribution device of a third exemplary embodiment.
Figure 10:
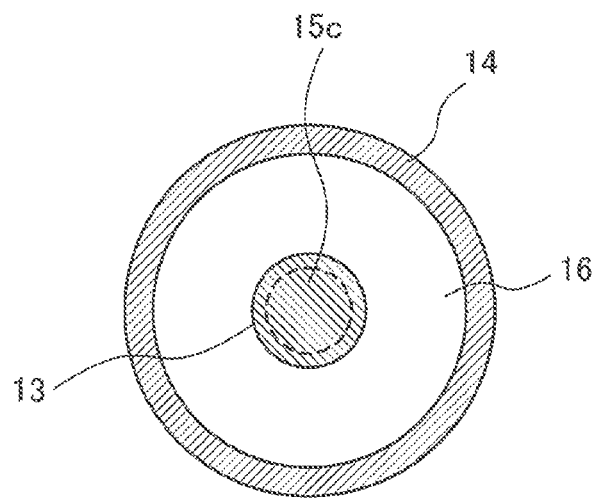
FIG. 10 is a sectional view seen from C of FIG. 9.

The third exemplary embodiment will be described with reference to FIG. 9 and FIG. 10. FIG. 9 is a sectional view of a refrigerant distribution device, and FIG. 10 is a sectional view seen from point C indicated in FIG. 9.

A cooling apparatus of this exemplary embodiment is only different in the structure of the refrigerant distribution device 10 described in the first exemplary embodiment, and description will be omitted about the other parts.

A difference between this exemplary embodiment and the first exemplary embodiment exists in the structure of a direction changing board 15c. Specifically, the direction changing board 15c having about the same shape (it should just be substantially identically-shaped) with the cross-sectional shape of the refrigerant sucking pipe 13 is provided directly on the upper end of the refrigerant sucking pipe 13 to form a uniformed shape. That is, it is a structure in which the direction changing board 15c covers the refrigerant sucking pipe opening 18a provided in the top end part of the refrigerant sucking pipe 13 of the first exemplary embodiment. Moreover, an opening 18b which makes an overflowed liquid-phase refrigerant flow in is provided in an upper-end side face of the refrigerant sucking pipe 13.

When the direction changing board 15c is produced in a unified shape so that the upper end of a refrigerant sucking pipe may be closed just like this exemplary embodiment, the direction changing board 15c and the refrigerant sucking pipe 13 can be handled as a single component, and easiness to assemble the refrigerant distribution device 10 is improved drastically.

Thus, by adopting the structure of this exemplary embodiment, manufacturability of the refrigerant distribution device 10 can be improved while obtaining the effect of the refrigerant distribution of the first exemplary embodiment.

(Fourth Exemplary Embodiment)

Figure 11:
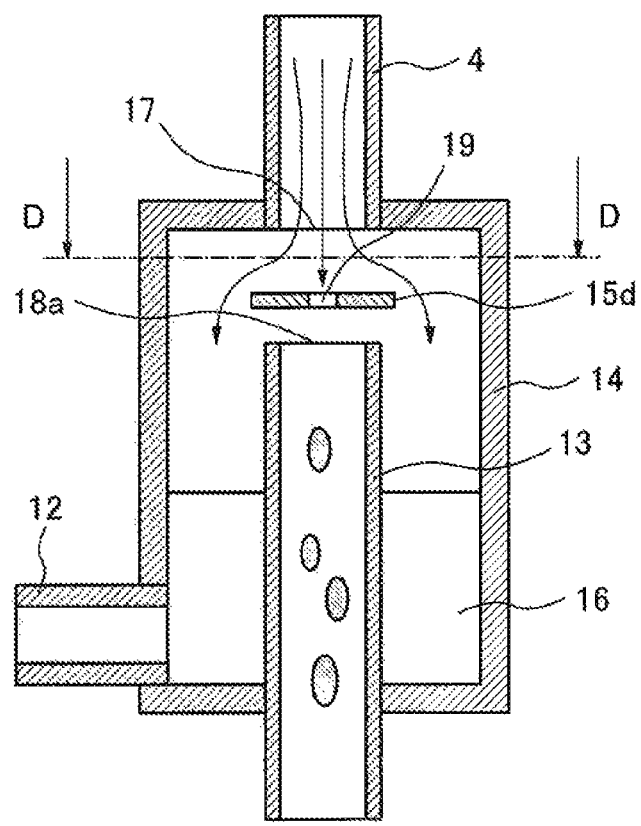
FIG. 11 is a sectional view of a refrigerant distribution device of a fourth exemplary embodiment.
Figure 12:
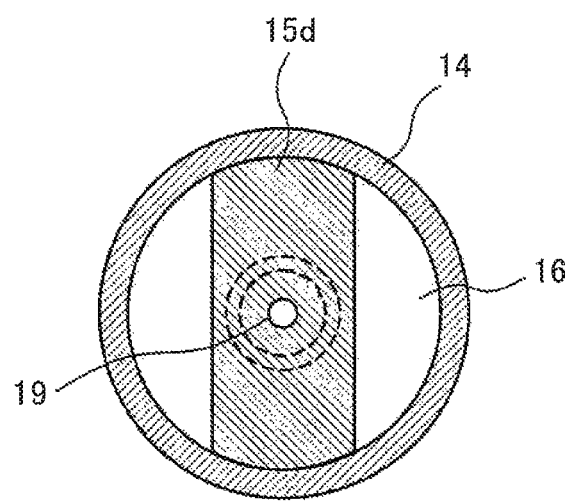
FIG. 12 is a sectional view seen from D of FIG. 11.

The fourth exemplary embodiment will be described with reference to FIG. 11 and FIG. 12. FIG. 11 is a sectional view of a refrigerant distribution device, and FIG. 12 is a sectional view seen from point D indicated in FIG. 11.

The cooling apparatus of this exemplary embodiment is different only in the structure of the refrigerant distribution device 10 described in the first exemplary embodiment, and description will be omitted about the other parts.

A difference between this exemplary embodiment and the first exemplary embodiment exists in the structure of a direction changing board 15d. Specifically, the direction changing board 15d has a small opening 19 in its central part, and makes part of a refrigerant of a liquid-phase refrigerant descending from the upper stream descend to the refrigerant sucking pipe 13 without changing its flow by the direction changing board 15d. When this opening 19 is large, most of a liquid-phase refrigerant which descends from the upper stream flows into the refrigerant sucking pipe 13 and a sufficient liquid-phase refrigerant cannot be stored in the storage part 16, and, thus, an enough refrigerant cannot be supplied to the heat receiver 1 connected. Therefore, it is desired that the opening 19 be of a size of about 5% to 50% of the diameter of the refrigerant sucking pipe 13.

According to this exemplary embodiment, a liquid-phase refrigerant which has descended from the upstream liquid-phase pipe 4 is changed its flowing direction by touching the direction changing board 15d, and flows into the storage part 16. However, on this occasion, when all of a liquid-phase refrigerant descending from the upper stream is poured into the storage part 16 by a direction changing board just like the first, second, and third exemplary embodiments, a refrigerant cannot be supplied to the heat receiver 1 of the lower portion until it overflows from the storage part 16. When a cooling apparatus of the present invention is required to absorb also exhaust heat of electronic equipment in lower portions of a rack immediately at the time of beginning of the operation, this exemplary embodiment is effective. That is, by providing the small opening 19 in part of the central part of a direction changing board, it is possible to supply a liquid-phase refrigerant to the next refrigerant distribution device 10 before the storage part 16 overflows, and a refrigerant can be supplied also to the heat receiver 1 of a lower portion gradually in the early stage.

(Fifth Exemplary Embodiment)

Figure 13:
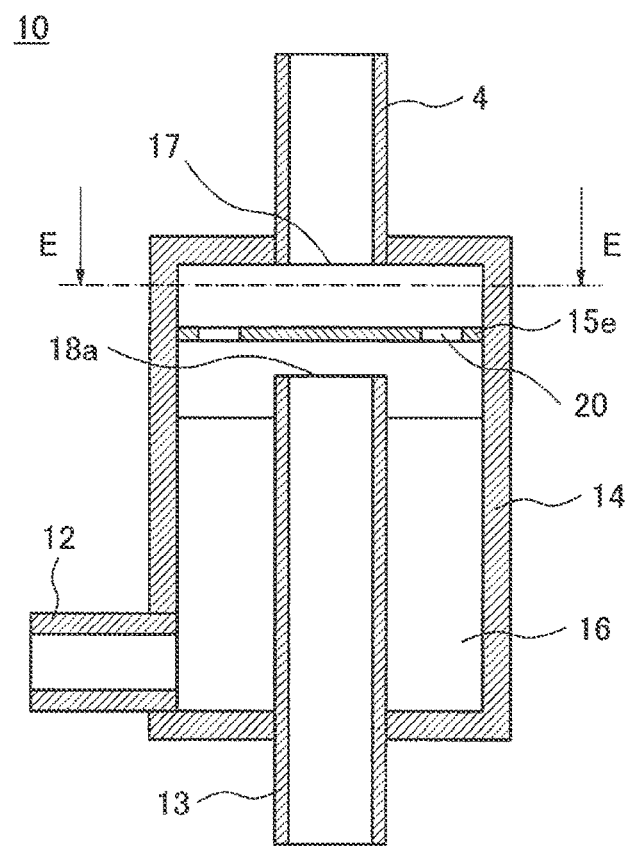
FIG. 13 is a sectional view of a refrigerant distribution device of a fifth exemplary embodiment.
Figure 14:
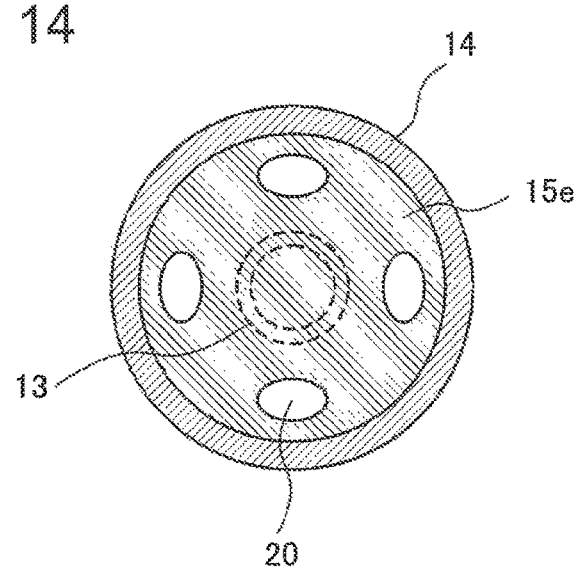
FIG. 14 is a sectional view seen from E of FIG. 13.

The fifth exemplary embodiment will be described with reference to FIG. 13 and FIG. 14. FIG. 13 is a sectional view of a refrigerant distribution device, and FIG. 14 is a sectional view seen from point E indicated in FIG. 13.

The cooling apparatus of this exemplary embodiment is just different in the structure of the refrigerant distribution device 10 described in the first exemplary embodiment, and, therefore, description will be omitted about the other parts.

A difference between this exemplary embodiment and the first exemplary embodiment exists in the structure of a direction changing board 15e. Specifically, the direction changing board 15e has the same shape as the inside cross-sectional shape of the main body formed by the branch outer wall 14. In other words, in this exemplary embodiment, the main body has a circular cross-sectional shape according to the branch outer wall 14, and, thus, the direction changing board 15e has the same shape as that, that is, a disc shape. The direction changing board 15e is arranged in the state that the inner wall of the branch outer wall 14 and the entire peripheral part of the direction changing board 15e are in contact with each other. The direction changing board 15e is provided between the upstream liquid-phase pipe opening 17 and the refrigerant sucking pipe opening 18a just like the first exemplary embodiment.

The direction changing board 15e has a structure in which a plurality of small openings 20 are provided in its peripheral parts and a liquid-phase refrigerant which descends from the upper stream is made to descend after its flow is changed.

According to this exemplary embodiment, fixing of the direction changing board 15e becomes easy, and easiness to assemble the refrigerant distribution device 10 is improved drastically.

Thus, by adopting the structure of this exemplary embodiment, manufacturability of the refrigerant distribution device 10 can be improved while obtaining the effect of the refrigerant distribution of the first exemplary embodiment.

Meanwhile, although the shape of the direction changing board 15e is a disc shape in this exemplary embodiment, the shape of the direction changing board 15e will be a shape such as a rectangle corresponding to the cross-sectional shape of the main body formed by the branch outer wall 14.

(Sixth Exemplary Embodiment)

Figure 15:
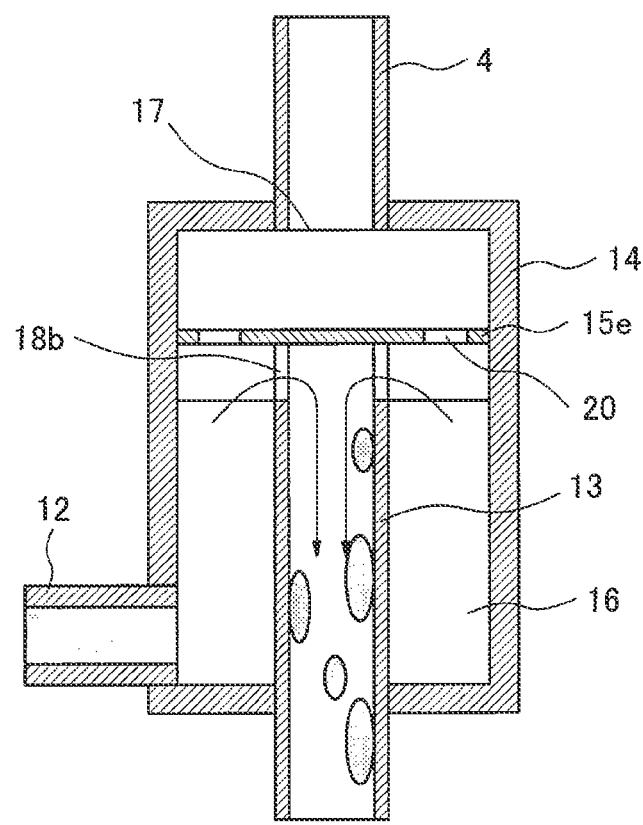
FIG. 15 is a sectional view of a refrigerant distribution device of a sixth exemplary embodiment.

The sixth exemplary embodiment will be described with reference to FIG. 15. FIG. 15 is a sectional view of a refrigerant distribution device.

The cooling apparatus of this exemplary embodiment is just different in the structure of the refrigerant distribution device 10 described in the fifth exemplary embodiment, and description will be omitted about the other parts.

A difference between this exemplary embodiment and the fifth exemplary embodiment exists in an installation position of the direction changing board 15e. The structure of the direction changing board 15e as a single body is not different from that of the fifth exemplary embodiment.

A different point is a point that the direction changing board 15e closes the upper end of the refrigerant sucking pipe 13, and, in a side face of the upper end of the refrigerant sucking pipe 13, the opening 18b into which an overflowed liquid-phase refrigerant is made to flow is provided.

According to this exemplary embodiment, fixing of the direction changing board 15e is easy just like the fifth exemplary embodiment, and easiness of assembly of the refrigerant distribution device 10 is improved drastically.

Thus, by adopting the structure of this exemplary embodiment, manufacturability of the refrigerant distribution device 10 can be improved while obtaining the effect of the refrigerant distribution of the first exemplary embodiment.

In the exemplary embodiments described above, all description has been made taking a direction changing board as an example of a refrigerant direction changing means, but the refrigerant direction changing means is not limited to be tabular. As other shapes, the refrigerant direction changing means may be of a hemisphere shape, a roof shape, or a shape having a net-shaped peripheral part. Specifically, a shape that is convex in the upper direction is desired in the case of a hemisphere shape and a roof shape.

As above, the present invention has been described taking the exemplary embodiments mentioned above as exemplary cases. However, the present invention is not limited to the exemplary embodiments mentioned above. That is, various aspects which a person skilled in the art can understand can be applied to the present invention within the scope of the present invention.

This application claims priority based on Japanese application Japanese Patent Application No. 2013-257936 filed on Dec. 13, 2013, the disclosure of which is incorporated herein in its entirety.

REFERENCE SIGNS LIST

1 Heat receiver
2 Radiator
3 Vapor-phase pipe
4 Liquid-phase pipe
5 Rack
6 Electronic equipment
10 Refrigerant distribution device
11 Vapor-phase tributary pipe
12 Liquid-phase tributary pipe
13 Refrigerant sucking pipe
14 Branch outer wall
15 Direction changing board
16 Storage part
17 Upstream liquid-phase pipe opening
18 Refrigerant sucking pipe opening
19, 20 Opening provided in part of a direction changing board

The invention claimed is:

1. A refrigerant distribution device to distribute a refrigerant supplied from an upper stream comprising:
   a main body including a side wall part, an upper face part and a bottom face part;
   an upstream pipe provided on the upper face part in a manner communicating with an inside of the main body;
   a downstream pipe provided in a state partially inserted inside the main body via an under face hole part provided in the bottom face part, wherein, an upper end of the downstream pipe facing the upstream pipe is closed with a refrigerant direction changer and a refrigerant inflow port is provided on a side face of the downstream pipe below the upper end; and
   a tributary pipe provided on the side wall part or the bottom face part in a manner communicating with the inside of the main body.

2. The refrigerant distribution device according to claim 1, wherein the refrigerant direction changer is provided in a manner making a refrigerant descending from the upstream pipe into the inside of the main body flow into an area different from an area of the downstream pipe.

3. The refrigerant distribution device according to claim 1, wherein the refrigerant direction changer is a direction changing board to change direction of a flow of the refrigerant descending into the inside of the main body.

4. The refrigerant distribution device according to claim 3, wherein a shape of the direction changing board is a shape identical with a cross-sectional shape of the downstream pipe substantially or a shape larger than the cross-sectional shape of the downstream pipe and smaller than an inner cross-sectional shape of the main body.

5. The refrigerant distribution device according to claim 3, wherein at least one opening is provided in part of the direction changing board.

6. The refrigerant distribution device according to claim 5, wherein a shape of the direction changing board is a shape substantially identical with the inner cross-sectional shape of the main body, and the at least one opening is provided in a peripheral part of the direction changing board.

7. A cooling apparatus, comprising:
   a plurality of heat receivers provided in a side face of a storing body storing electronic equipment;
   a radiator provided outside the storing body;
   a first pipe to make the plurality of heat receivers and the radiator be in communication with each other;
   a second pipe to make the radiator and the plurality of heat receivers communicate with each other; and
   a refrigerant distribution device to distribute a refrigerant supplied from an upper stream provided in each branching part of the second pipe to the plurality of heat receivers, comprising:
      a main body including a side wall part, an upper face part and a bottom face part;
      an upstream pipe provided on the upper face part in a manner communicating with an inside of the main body;
      a downstream pipe provided in a state partially inserted inside the main body via an under face hole part provided in the bottom face part, wherein an upper end of the downstream pipe facing the upstream pipe is closed with a refrigerant direction changer and a refrigerant inflow port is provided on a side face of the downstream pipe below the upper end; and
      a tributary pipe provided on the side wall part or the bottom face part in a manner communicating with an inside of the main body.

8. The cooling apparatus according to claim 7, further comprising at least one additional refrigerant distribution device, wherein the refrigerant distribution device and the at least one additional refrigerant distribution device constitute a plurality of refrigerant distribution devices, and wherein the plurality of refrigerant distribution devices are connected in series in a vertical direction, and each of the plurality of the refrigerant distribution devices supplies the refrigerant supplied from the upstream pipe to the heat receiver connected via the tributary pipe and the lower refrigerant distribution device connected via the downstream pipe.

* * * * *